United States Patent

Yamamoto

Patent Number: 5,463,631
Date of Patent: Oct. 31, 1995

[54] ERROR PULSE WIDTH EXPANDING CIRCUIT

[75] Inventor: Shuji Yamamoto, Osaka, Japan

[73] Assignee: Fujitsu Limited, Kawasaki, Japan

[21] Appl. No.: 272,518

[22] Filed: Jul. 11, 1994

Related U.S. Application Data

[63] Continuation of Ser. No. 788,677, Nov. 6, 1991, abandoned.

[30] Foreign Application Priority Data

Nov. 7, 1990 [JP] Japan ..... 2-303254

[51] Int. Cl.$^6$ ..... G06F 11/00
[52] U.S. Cl. ..... 371/5.1; 371/5.3
[58] Field of Search ..... 371/5.1, 5.2, 5.3, 371/5.4, 5.5

[56] References Cited

U.S. PATENT DOCUMENTS

| | | | |
|---|---|---|---|
| 3,655,959 | 4/1972 | Chernow et al. | 235/153 |
| 4,006,977 | 2/1977 | Harrow et al. | 352/133 |
| 4,034,340 | 7/1977 | Sant'Agostino | 340/146.1 R |
| 4,085,288 | 4/1978 | Viswanathan | 178/69.1 |
| 4,234,953 | 11/1980 | Kline | 371/5.4 |
| 4,363,123 | 12/1982 | Grover | 371/5.3 |
| 4,385,383 | 5/1983 | Karchevski | 371/5.3 |
| 4,490,688 | 12/1984 | Borras et al. | 331/1 A |
| 4,502,024 | 2/1985 | Nishikawa et al. | 332/9 R |
| 4,675,867 | 6/1987 | Masui et al. | 371/31 |
| 4,726,022 | 2/1988 | Chan et al. | 371/5.1 |
| 4,847,613 | 7/1989 | Sakurai et al. | 340/825.21 |
| 5,123,020 | 6/1992 | Yoshimura et al. | 371/68.1 |

FOREIGN PATENT DOCUMENTS 0405384  2/1991  United Kingdom ..... H04L 1/24

Primary Examiner—Robert W. Beausoliel, Jr.
Assistant Examiner—Joseph E. Palys
Attorney, Agent, or Firm—Nikaido, Marmelstein, Murray & Oram

[57] ABSTRACT

A circuit structure for expanding the width of a plurality of error pulses detected in the data of one frame during digital transmission is described. A plurality of error pulses are counted by a counting circuit and the counted value is inputted to a pulse generating circuit. The pulse generating circuit outputs the frequency-divided clock pulses outputted from the frequency dividing circuit as many as the counted value. The frequency-divided clock pulse is obtained by dividing the frequency of the reference clock pulse of data with a predetermined rate and this frequency-divided clock pulse is outputted from the pulse generating circuit as the error pulse. The error pulse expanded in time only during such a frequency dividing period is very useful for improving the reliability of error rate detection.

3 Claims, 4 Drawing Sheets

ERROR PULSE WIDTH EXPANDING CIRCUIT

This application is a continuation of application Ser. No. 07/788,667 filed Nov. 6, 1991, now abandoned.

BACKGROUND OF THE INVENTION

1. Field of the Invention

The present invention relates to an error pulse width expanding circuit and more particularly to a circuit for expanding the width of a plurality of error pulse detected sequentially within one frame during digital transmission.

2. Description of the Prior Art

In the digital transmission, a parity check system has been known as a method for detecting an error rate of transmission path. In this parity check system, a number of logic value "1" in the transmitting data is counted, for example, in the transmitting side. In the case where a result of the predetermined one frame is even, "0" is inserted to the determined position of the next frame and is then transmitted. On the other hand, in the case the result is odd, "1" is inserted and transmitted. In the receiving side, a value counted from the receiving data is compared, in the same manner as the transmitting side, with the bit (parity bit) inserted in the transmitting side. If these values are different, these data are detected and processed as the error pulses in an error counter.

This error pulse continues for the period as long as one frame and is equal to the one bit length of the main signal. Therefore, it has a very short pulse width. Accordingly, an error counting circuit, which sufficiently counts the error pulse in low speed operation by expanding the pulse width of the error pulse and realizes improvement in reliability of error detection and simplification of circuit structure, has been proposed in the Japanese unexamined patent publication Tokukai-Sho 64-46339. However, this conventional circuit is provided for expanding pulse width of error pulses detected bit by bit in each frame. Therefore, this circuit provides a problem that it cannot be applied to the system where a plurality of parity bits (error pulse) exist within the one frame such as the frame format of the STS-12 signal which is employed, for example, in the SONET (Synchronous Optical NETwork) as the broadband ISDN.

SUMMARY OF THE INVENTION

It is a principal object of the present invention to provide an error pulse width expanding circuit which ensures detection of error pulse by expanding the pulse width of a plurality of error pulses existing within the one frame data.

It is another object of the present invention to provide an error pulse width expanding circuit having a circuit structure for easily adjusting the pulse width of error pulses.

Briefly, the present invention is a circuit for expanding, in time, a plurality of error pulses detected in each frame and then outputting such error pulses, comprising a counting means for counting error pulses, a frequency-dividing means for dividing frequency of reference clock pulse of data with a predetermined ratio and a pulse generating means for continuously outputting frequency-divided clock pulses as many as counted by the counting means.

The other objects and features of the present invention will become more apparent from description about the preferred embodiment with reference to the accompanying drawings.

DESCRIPTION OF THE PREFERRED EMBODIMENT

Prior to explanation about an embodiment of the present invention, a basic composition of the present invention will be explained with reference to FIG. 1.

Figure 1:
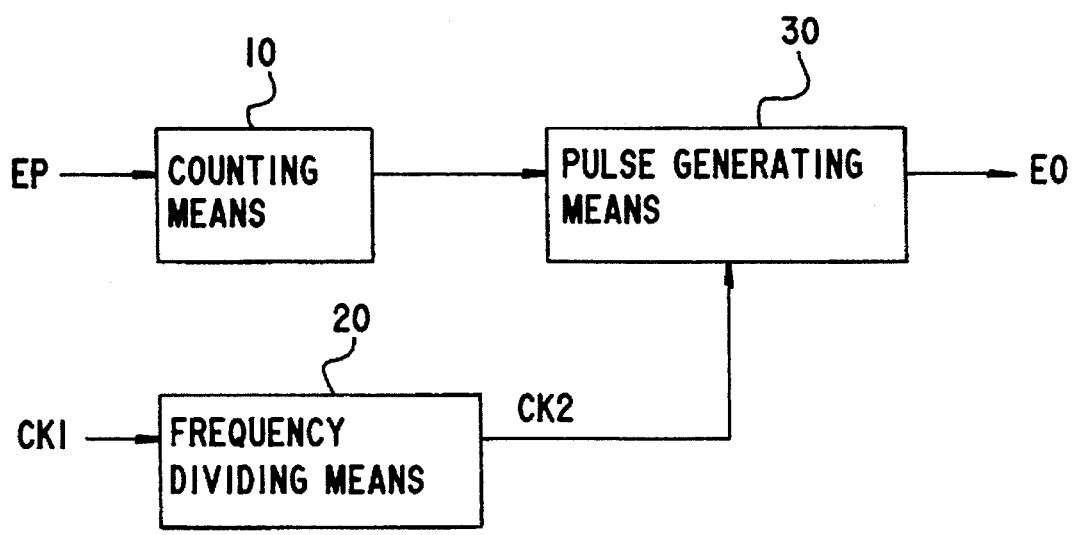
FIG. 1 is schematic block diagram of an error pulse width expanding circuit of the present invention.

Namely, in FIG. 1, the reference numeral 10 denotes a counting means for counting a plurality of error pulses EP detected in the data of one frame; 20, a frequency dividing means for dividing the frequency of the reference clock pulse CK1 of data with the predetermined rate; 30, a pulse generating means for outputting continuously the frequency-divided clock pulses as many as counted by the counting means 10.

If a plurality of error pulses are detected for each frame by an error pulse detecting circuit not illustrated, such plural error pulses EP are inputted to the counting means 10. This counting means 10 counts such error pulses and inputs the counted value to a pulse generating means 30. This pulse generating means 30 receives the clock pulses CK1 frequency-divided by the frequency dividing means 20 and outputs continuously the frequency-divided clock pulses as the expanding error pulses EO as many as counted by the counting means 10. Therefore, a plurality of error pulses included in each frame are expanded as much as the frequency-dividing period in the frequency dividing means 20 and are then outputted from the pulse generating means 30.

Next, an embodiment of the present invention conforming to the basic composition described above will be explained in detail.

Figure 4:
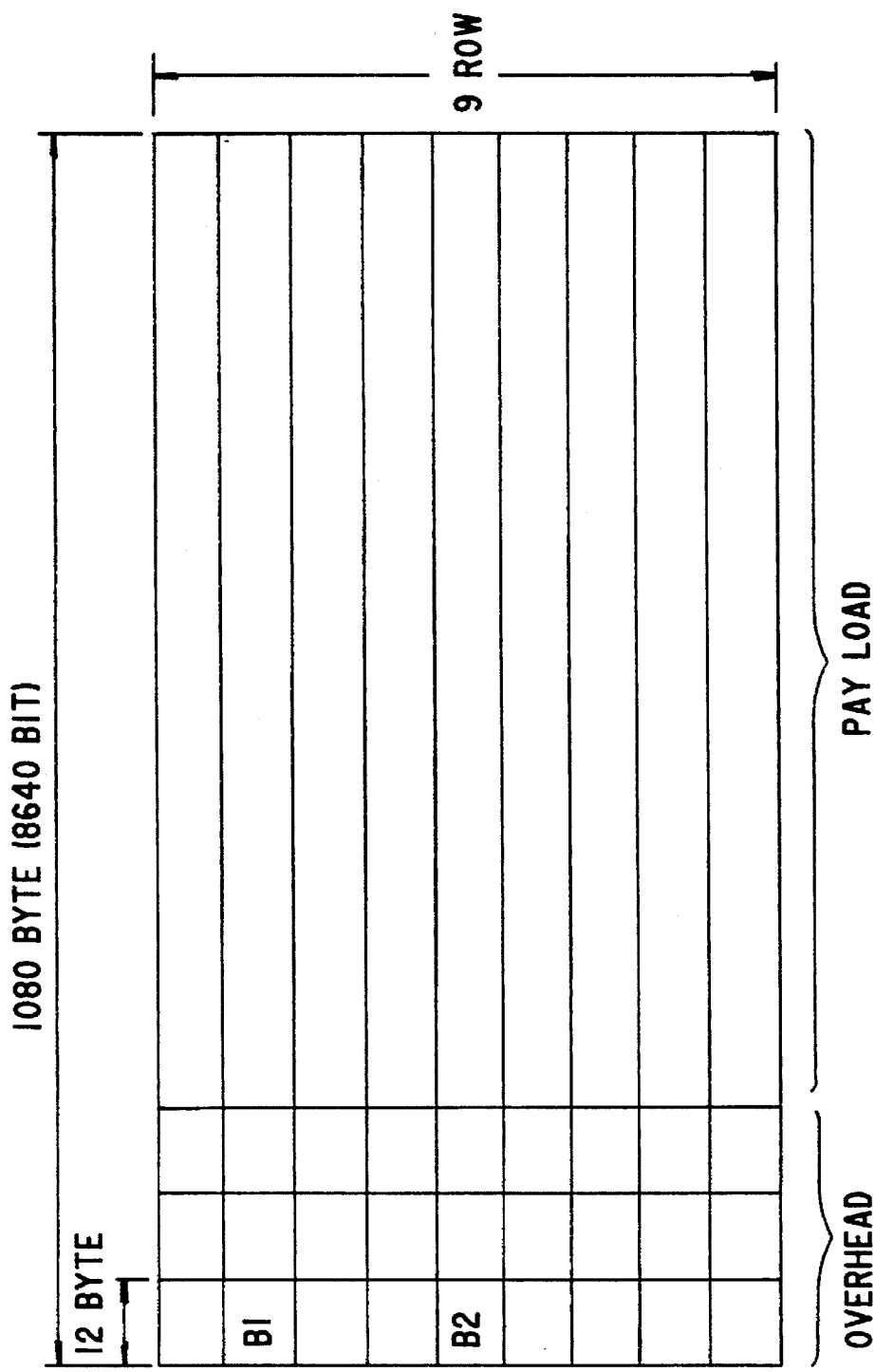
FIG. 4 is a diagram for explaining a frame format of the STS-12 signal to be applied to an embodiment of the present invention.

FIG. 4 shows a frame format of the STS-12 signal of SONET explained above to be applied to the preferred embodiment of the present invention. This STS-12 signal can be obtained by multiplexing the well known STS-1 signal into the dodecuple signals by the byte multiplexing method. The one frame of this dodecuple signal is formed by 1080 bytes (90 bytes×dodecuple)×9 rows. In practice, the frame format is classified into an overhead portion and a payload portion as indicated in the figure. The region B1 of overhead portion contains the parity bit of eight bits, while the region B2 contains the parity bit of 96 bits. As explained above, it is probable that a maximum of 96 error pulses are detected in the one frame by the data transmission of the SONET system.

Figure 2:
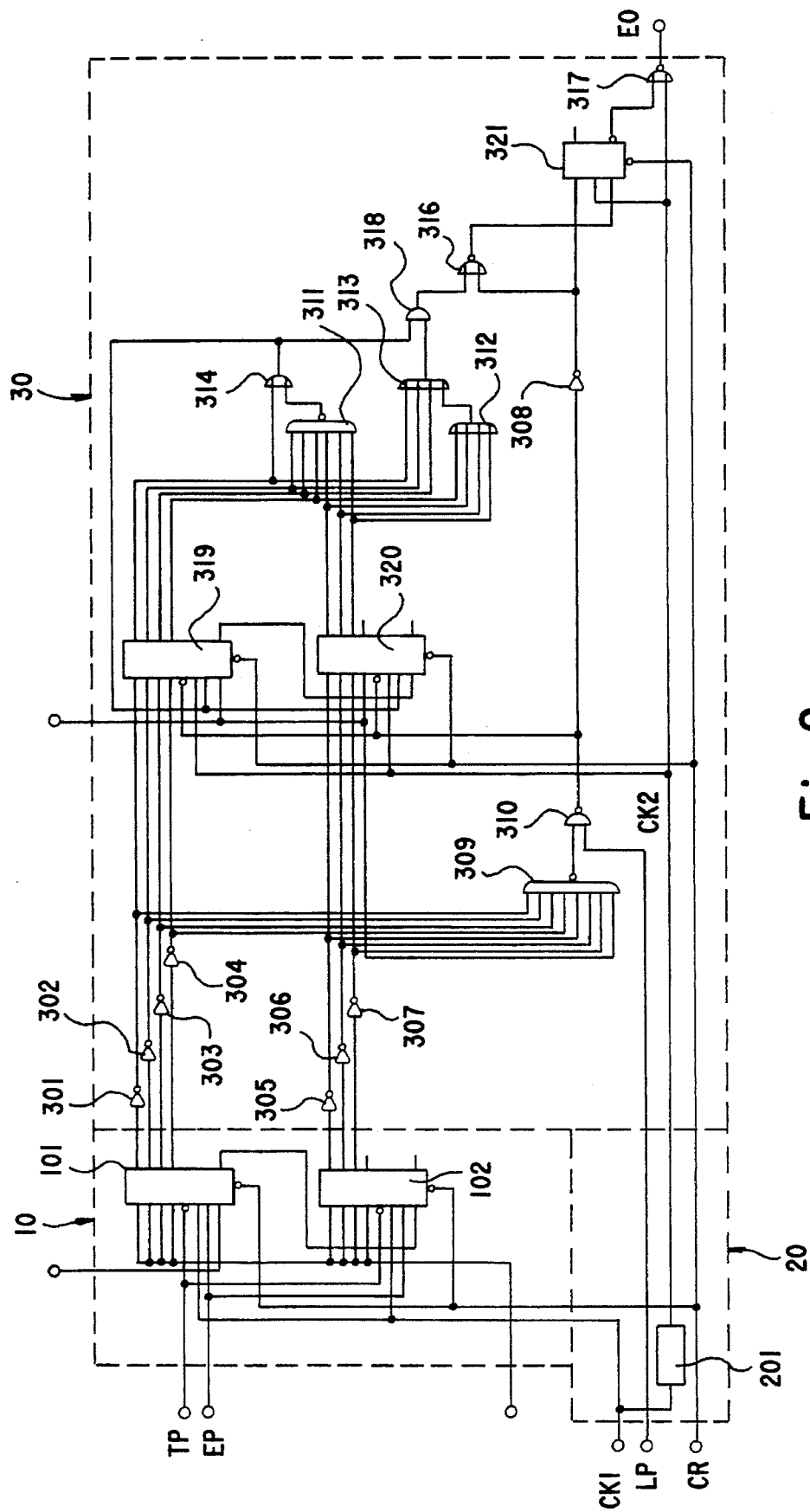
FIG. 2 is a circuit diagram for explaining an embodiment of the present invention.

The embodiment of the present invention shown in FIG. 2 realizes a circuit for continuously outputting 96 error pulses after expanding these pulses in time and is formed by TTL logic circuits.

In FIG. 2, the counting means 10 for counting error pulses is formed by a couple of synchronous 4-bit counters 101, 102. The frequency-dividing means 20 is formed by a frequency-dividing circuit 201 for dividing the frequency of the reference clock pulse CK1 into 1/27. Moreover, a pulse generating means 30 is formed by eight inverters 301–308, connected as shown in the figure, three NAND gates 309–311, three OR gates 312–314, two NOR gates 316, 317, one AND gate 318, two synchronous 4-bit counters 319,320 and one JK flip-flop circuit 321. The counters 101, 102, 319, 320 uses TTL 74161 produced by Fujitsu, the inverters 301–308 by TTL 7404 of the same maker, the NAND gates 309–311 by TTL 7430 of the same maker, the NAND gate 310 by TTL 7400 of the same maker, the OR gates 312, 313 by TTL 7432 of the same maker, the NOR gates 316, 317 by TTL 7402 of the same maker, the AND gate 318 by TTL 7408 of the same maker, and the flip-flop circuit 321 by TTL 7434 of the same maker.

Moreover, in FIG. 2, TP indicates a position pulse representing the position of the region B2 in the frame format shown in FIG. 4 and this position pulse is inputted to the LOAD terminal of counters 101 and 102. EP indicates an error pulse detected in the same region B2 and this error pulse is inputted to the ENABLE-P terminal of the counters 101 and 102. CK1 indicates a reference clock pulse to be inputted to the CLOCK terminal of the counters 101 and 102.

LP indicates a load pulse outputted in the timing for completing output of error pulse from the region B of the frame format, for example, in the timing corresponding to the position rather backward from the intermediate point of the one frame because an error is usually concentrated in almost the intermediate area of the one frame. This load pulse is inputted to the NAND gate 310. CR is a clear signal and is inputted to the CLEAR terminals of the counters 101, 102, 319, 320 and JK flip-flop 321. The data input terminals of counters 101 and 102 are all grounded, the ENABLE-T terminals of the counters 101 and 319 are connected to the power supply so that the logic value "1" is always inputted thereto and the RIPPLE-CARRY output terminal of the counters 101, 319 is connected respectively to the ENABLE-T terminal of the counters 102, 320.

Since the frame format applied to this embodiment includes 96 error pulses in maximum, a 7-bit binary counter is formed by the 4-bit counters 101 and 102. Outputs of these counters 101,102 are polarity-inverted by the inverters 301–307 and are inputted to the data input terminals of the counters 319,320 and also inputted to the NAND gate 309. Moreover, an output of the NAND gate 309 is inputted to the NAND gate 310 together with the load pulse LP and an output of the NAND gate 310 is inputted to the inverter 308 and the LOAD terminals of the counters 319, 320.

The frequency-divided clock pulse CK2 is inputted to the CLOCK terminals of counters 319, 320, CLOCK terminal of the JK flip-flop 321 and to the NOR gate 317. Outputs of the counters 319, 320 are inputted to the OR gates 312, 313. Moreover, three outputs among seven outputs of the counters 319, 320 are inputted to the NAND gate 311 and the remaining one output is inputted to the OR gate 314 with the output of NAND gate 311. An output of the OR gate 314 is respectively inputted to the ENABLE-P terminal of the counters 319, 320 and is then inputted to the AND gate 318 with the output of OR gate 313. An output of AND gate 318 and an output of inverter 308 are inputted to the NOR gate 316 and an output of NOR gate 316 is inputted to the K terminal of the JK flip-flop 321.

An output of $\bar{Q}$ terminal of JK flip-flop 321 is inputted to the NOR gate 317 with the frequency-divided clock pulse CK2 and the NOR gate 317 outputs an expanded error pulse EO.

Figure 3A:
FIG. 3 is a timechart for explaining operations of the circuit of FIG. 2.
Figure 3B:
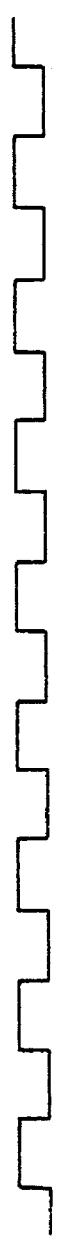
Figure 3C:
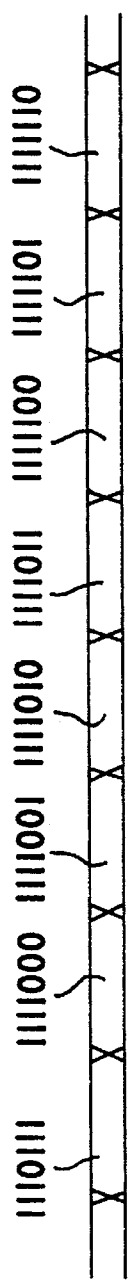

Next, operations of the circuit having such composition will be explained hereunder using a timechart of FIG. 3. If, it is assumed here that eight error pulses EP exist in the region B2 of the frame format shown in FIG. 4, such error pulse EP is inputted to the counters 101, 102 and is counted up. When the load pulse LP is inputted as shown in FIG. 3(a) in the timing for completing the error pulse in the region B2, a count value "8" of counters 101, 102 is polarity-inverted by the inverters 301–307, so as to be loaded to the counters 319, 320. The counters 319, 320 start the counting synchronously with the clock pulse having the frequency of 1/27 shown in FIG. 3(b) and continuously output the data from the logic value "1110111" corresponding to value "8" to the logic value "1111110" corresponding to value "1". Namely, the counters 319, 320 makes count-down responsive to input of frequency-divided clock pulse.

Figure 3D:
Figure 3E:

On the other hand, since the output of Q terminal of JK flip-flop 321 takes a logic value "1" as shown in FIG. 3(d) while the counters 319, 320 output the data, the NOR gate 317 sequentially outputs eight frequency divided clock pulses, namely the expanded error pulses EO as shown in FIG. 3(e). The NAND gate 311 and NOR gate 314 are provided for stopping the count operation of the counters 319, 320 when the data outputted therefrom becomes "1111110" while the NAND gates 309, 310 are provided for rejecting the load pulse LP when the error pulse EP is not inputted and the OR gates 312, 313 are provided for preventing malfunction after the reset condition of counters 319, 320 is cancelled.

In above embodiment, frequency dividing ratio of the frequency dividing circuit 202 is set to 1/27 but the pulse width of the expanded error pulse can be changed freely by changing the frequency dividing ratio, considering that the expanded error pulses EO are all outputted within the current frame.

According to an embodiment of the present invention, the pulse width of a plurality of error pulse detected in the one frame can be expanded and these error pulses can be outputted serially and moreover the pulse width of error pulse can be set freely. Thereby, the error pulse can be monitored very easily. Therefore, reliability of error rate detection can be improved by applying the present invention to the data transmission of SONET system.

The present invention is limited only by the scope of the appended claims.

What is claimed is:

1. An error pulse width expanding circuit for expanding, in time, a plurality of error pulses detected in the data of a frame and then outputting such error pulses, comprising:

a counting means for counting error pulses;

a frequency-dividing means for dividing the frequency of a reference clock pulse of data with a predetermined rate based on a maximum number of error pulses detected during one frame, such that said frequency-dividing means outputs a frequency-divided clock pulse corresponding to the maximum number of error pulses detected during the one frame; and a pulse generating means, connected to the counting means and frequency-dividing means, for continuously outputting frequency-divided error clock pulses, as many as counted by said counting means.

2. A error pulse width expanding circuit according to claim 1, wherein said pulse generating means comprises:
   a counter circuit for counting frequency-divided clock pulses as many as counted by said counting means; and
   a flip-flop circuit for outputting the frequency-divided clock pulses only while said counter circuit is counting said frequency divided clock pulses.

3. A error pulse width expanding circuit according to claim 2, wherein said counting means is formed by a count-up type counter, while said counter circuit is formed by a count-down type counter.

* * * * *